(12) United States Patent
Cheon et al.

(10) Patent No.: US 9,287,341 B2  
(45) Date of Patent: Mar. 15, 2016

(54) FLEXIBLE DISPLAY DEVICE INCLUDING FOLDING SECTION

(71) Applicant: Samsung Display Co., Ltd., Yongin, Gyeonggi-Do (KR)

(72) Inventors: Jun Hyuk Cheon, Seoul (KR); Kwang Jun Kim, Seoul (KR); Hee June Kwak, Yongin-si (KR); Mu Gyeom Kim, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/530,506

(22) Filed: Oct. 31, 2014

(65) Prior Publication Data

US 2015/0357395 A1  Dec. 10, 2015

(30) Foreign Application Priority Data

Jun. 10, 2014 (KR) ......................... 10-2014-0070390

(51) Int. Cl.  
*H01L 27/32* (2006.01)  
*H01L 51/52* (2006.01)

(52) U.S. Cl.  
CPC ........ *H01L 27/3276* (2013.01); *H01L 27/3213* (2013.01); *H01L 27/3216* (2013.01); *H01L 27/3218* (2013.01); *H01L 27/3237* (2013.01); *H01L 51/52* (2013.01); *H01L 2251/5338* (2013.01)

(58) Field of Classification Search  
None  
See application file for complete search history.

(56) References Cited

U.S. PATENT DOCUMENTS

| | | | |
|---|---|---|---|
| 8,837,126 B2* | 9/2014 | Cho et al. | 361/679.01 |
| 2009/0021666 A1* | 1/2009 | Chen | 349/58 |
| 2012/0218219 A1 | 8/2012 | Rappoport et al. | |
| 2013/0222998 A1* | 8/2013 | Cho et al. | 361/679.27 |
| 2014/0217373 A1* | 8/2014 | Youn et al. | 257/40 |
| 2014/0217397 A1* | 8/2014 | Kwak et al. | 257/43 |
| 2014/0232956 A1* | 8/2014 | Kwon et al. | 349/12 |
| 2014/0299884 A1* | 10/2014 | Park et al. | 257/72 |
| 2015/0023030 A1* | 1/2015 | Tsukamoto | 362/419 |

FOREIGN PATENT DOCUMENTS

KR  10-0967362 B1  7/2010  
KR  10-1217554 B1  1/2013

\* cited by examiner

*Primary Examiner* — Joseph Schoenholtz  
(74) *Attorney, Agent, or Firm* — Innovation Counsel LLP

(57) ABSTRACT

A flexible display device includes a folding section formed on a flexible substrate, a flat section connected to the folding section, and a display area for displaying an image, wherein the display area is formed on the folding section and the flat section, wherein each of the display areas of the folding section and the flat section includes a plurality of pixels and a plurality of wires for supplying electrical signals to the pixels, and wherein the wires in the display area of the folding section include a winding wire extending in a winding configuration on the flexible substrate.

17 Claims, 22 Drawing Sheets

FLEXIBLE DISPLAY DEVICE INCLUDING FOLDING SECTION

RELATED APPLICATIONS

This application claims priority to and the benefit of Korean Patent Application No. 10-2014-0070390 filed in the Korean Intellectual Property Office on Jun. 10, 2014, the entire contents of which are incorporated herein by reference.

BACKGROUND

1. Technical Field

The present disclosure relates to a flexible display device, and more particularly, to a flexible display device including a foldable display part for displaying an image.

2. Description of the Related Art

Numerous display technologies have been developed to display vast amount of information in today's age. In particular, efforts have been made to reduce the weight and thickness (form factor) of the display devices for greater portability.

The display devices generally include liquid crystal displays (LCD), organic light emitting diode (OLED) displays, etc. The display devices can be used in various products such as mobile phones and tablets.

The display devices are often provided in the form of flat panel displays. The liquid crystal display is a type of flat panel display that is widely used. Since the liquid crystal display is a non-emissive display device, a separate light source (such as a backlight) is required. In contrast, an organic light emitting diode (OLED) display is self-luminous and does not require a backlight. The organic light emitting diode display typically includes two electrodes disposed facing each other, and an organic layer interposed between the electrodes. In the organic light emitting diode display, light is generated when holes (injected from an anode) and electrons (injected from a cathode) meet at a light emitting layer to generate an exciton which is then subject to photo-luminescence quenching.

In the organic light emitting diode display or liquid crystal display, a flexible display device can be formed using a bendable substrate. However, constituent elements such as pixels and/or wires formed in the flexible display device may have bent or folded portions, and those portions may deform or mechanically damaged due to stresses generated from repeated folding.

The above information disclosed in this Background section is only to enhance understanding of the background of the described technology and therefore it may contain information that does not form the prior art that is already known in this country to a person of ordinary skill in the art.

SUMMARY

The present disclosure addresses at least the above issues relating to the deformation of wires in a flexible display device due to repeated folding. Specifically, the inventive concept discloses a flexible display device including flexible wires that have minimal deformation with repeated folding and unfolding. The inventive concept also discloses a flexible display device in which the shape of the pixels can be changed and optimized to correspond to the shape of the flexible wires, such that the flexible display device can withstand the compressive and/or tensile stresses generated from repeating folding.

According to an exemplary embodiment of the inventive concept, a flexible display device includes: a folding section formed on a flexible substrate; a flat section connected to the folding section; and a display area for displaying an image, wherein the display area is formed on the folding section and the flat section, wherein each of the display areas of the folding section and the flat section includes a plurality of pixels and a plurality of wires for supplying electrical signals to the pixels, and wherein the wires in the display area of the folding section include a winding wire extending in a winding configuration on the flexible substrate.

In one embodiment, the winding wire in the display area of the folding section may be formed having a wave-line shape.

In one embodiment, the winding wire in the display area of the folding section may include a bent portion that extends and bends at a predetermined angle.

In one embodiment, the winding wire in the display area of the folding section may branch out and extend from the wires in the display area of the flat section, and a vertical width of the winding wire may repeatedly increase and decrease along a direction in which the winding wire extends.

In one embodiment, the wires in the display area of the folding section may have a longer length per unit area than the wires in the display area of the flat section.

In one embodiment, the winding wire in the display area of the folding section may extend in a direction in which the folding section is folded.

In one embodiment, the winding wire in the display area of the folding section may include a gate wire.

According to another exemplary embodiment of the inventive concept, a flexible display device includes: a folding section; a flat section connected to the folding section; and a display area for displaying an image, wherein the display area is formed on the folding section and the flat section, wherein each of the display areas of the folding section and the flat section includes a plurality of pixels, and wherein the pixels in the display area of the folding section have boundaries that are inclined with respect to the boundaries of the pixels in the display area of the flat section.

In one embodiment, the pixels in the display area of the folding section may have a rhombic shape.

In one embodiment, each pixel in the display area of the folding section may be divided into at least three subpixels.

In one embodiment, each pixel in the display area of the folding section may be equally divided into four subpixels, and the four subpixels may respectively emit red light, green light, blue light, and white light.

In one embodiment, the display area of the folding section may include pixels that are smaller than the pixels in the display area of the flat section.

According to a further exemplary embodiment of the inventive concept, a flexible display device includes: a folding section formed on a flexible substrate; a flat section connected to the folding section; and a display area for displaying an image, wherein the display area is formed on the folding section and the flat section, wherein each of the display areas of the folding section and the flat section includes a plurality of pixels and a plurality of wires for supplying electrical signals to the pixels, wherein the wires in the display area of the folding section include a winding wire extending in a winding configuration on the flexible substrate, and wherein the pixels in the display area of the folding section have boundaries that are inclined with respect to the boundaries of the pixels in the display area of the flat section.

In one embodiment, the winding wire may include a portion extending parallel to the boundaries of the pixels in the display area of the folding section.

In one embodiment, the winding wire may branch out and extend from the wires in the display area of the flat section, and surround the pixels in the display area of the folding section.

In one embodiment, the flat section may include at least two flat sections, and the folding section may be disposed between adjacent flat sections.

In one embodiment, the display area may be an organic light emitting diode display panel.

BRIEF DESCRIPTION OF THE DRAWINGS

FIG. 4 also illustrates magnified views of the respective pixel units in the flat section and the folding section.

DETAILED DESCRIPTION

Figure 1:
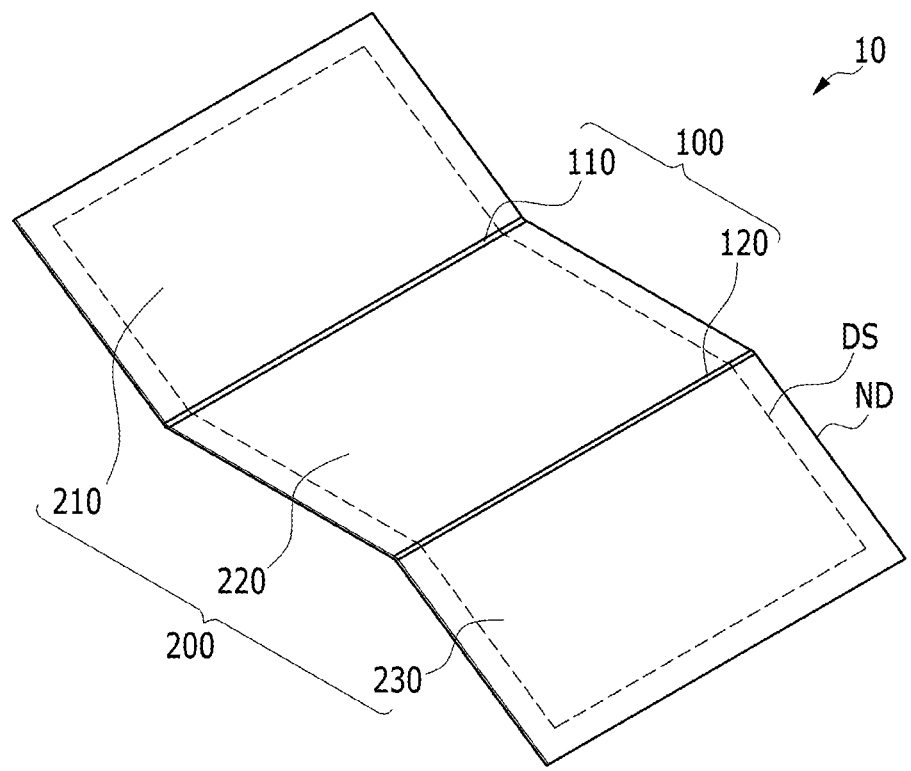
FIG. 1 is a perspective view illustrating a flexible display device according to an exemplary embodiment.

The inventive concept will be described more fully herein with reference to the accompanying drawings, in which exemplary embodiments are shown. As those skilled in the art would realize, the embodiments may be modified in various ways without departing from the spirit or scope of the inventive concept. The drawings and description are merely illustrative in nature and should not be construed in an overly-restrictive manner. Like reference numerals designate like elements throughout the specification. In the drawings, the size and thickness of each element may be exaggerated for clarity. It will be understood that when an element such as a layer, film, region, or substrate is referred to as being "on" another element, it can be disposed either directly on the other element or with one or more intervening elements being present.

Figure 2A:
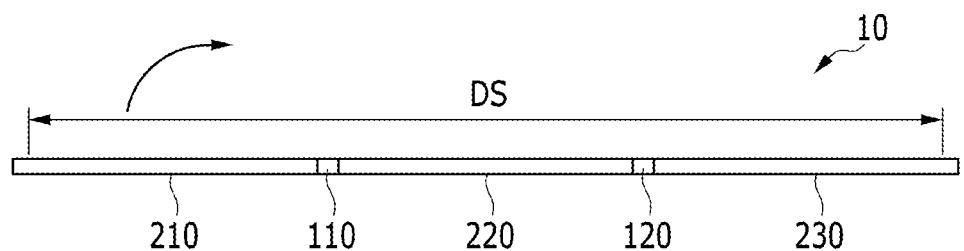
FIG. 2A to FIG. 2C schematically illustrate a configuration in which the flexible display device shown in FIG. 1 can be folded.
Figure 2B:
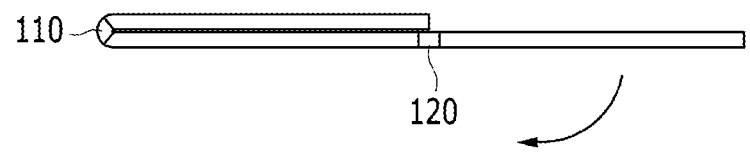
Figure 2C:
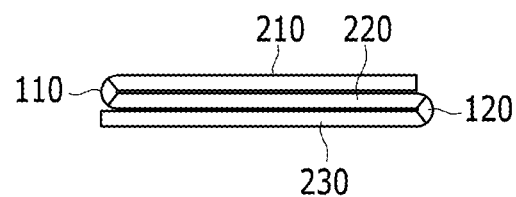

FIG. 1 is a perspective view illustrating a flexible display device according to an exemplary embodiment. FIG. 2A to FIG. 2C schematically illustrate a configuration in which the flexible display device shown in FIG. 1 can be folded.

Referring to FIG. 1, a flexible display device 10 may include a display area DS and a non-display area ND. The non-display area ND is disposed surrounding the display area DS. The display area DS may display an image, and the non-display area ND may serve as a frame for the display area DS. Signal wires for transmitting driving signals (for displaying an image on the display area DS) and a driving chip for controlling the driving signals may be disposed on or connected to the non-display area ND.

The flexible display device 10 is a foldable display device, and includes a folding section 100 and a flat section 200. The folding section 100 may include a plurality of folding sections (e.g., two folding sections 110 and 120), and the flat section 200 may include a plurality of flat sections (e.g., three flat sections 210, 220, and 230). The folding section 100 may be disposed between two adjacent flat sections 200, and the three flat sections 210, 220, and 230 may be divided by the two folding sections 110 and 120 as shown in FIG. 1. The flexible display device 10 may be fabricated such that it can be folded at the folding section 100. Specifically, the flexible display device 10 may be folded such that display areas on the adjacent flat sections 200 face each other, and/or rear surfaces of the adjacent flat sections 200 face each other.

Referring to FIG. 2A to FIG. 2C, the flexible display device 10 (including the three flat sections 210, 220, and 230 and the two folding sections 110 and 120) is folded such that the display areas on the first flat section 210 (located at a left side of the drawing) and the second flat section 220 (located at the center of the drawing) face each other, and the rear surfaces of the third flat section 230 (located at a right side of the drawing) and the second flat section 220 face each other.

Figure 3A:
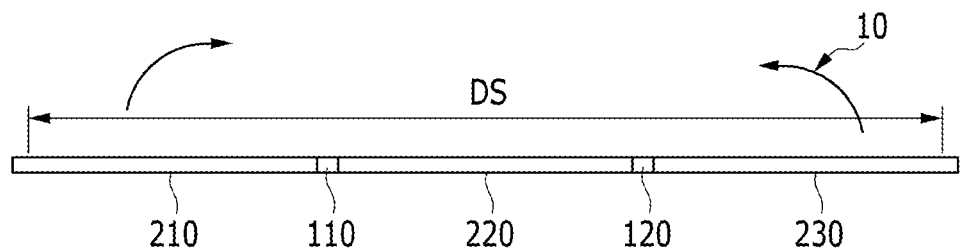
FIG. 3A to FIG. 3C schematically illustrate another configuration in which the flexible display device shown in FIG. 1 can be folded.
Figure 3B:
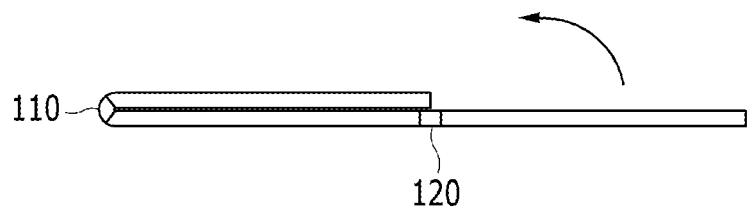
Figure 3C:
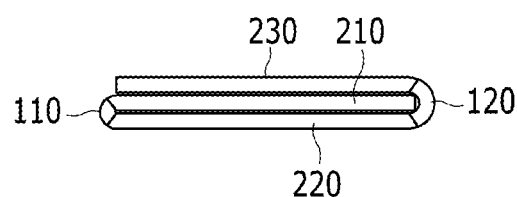

FIG. 3A to FIG. 3C schematically illustrate another configuration in which the flexible display device shown in FIG. 1 can be folded. Referring to FIG. 3A to FIG. 3C, the flexible display device 10 (including the three flat sections 210, 220, and 230 and the two folding sections 110 and 120) is folded such that display areas DS on the first flat section 210 (located at a left side of the drawing) and the second flat section 220 (located at the center of the drawing) face each other, and the first flat section 210 is covered by the third flat section 230 (located at a right side of the drawing).

When the flexible display device 10 is folded at the folding sections 110 and 120, a compressive stress or a tensile stress may be exerted onto the wires in the display areas DS formed at the folding sections 110 and the 120 in a folded state. The shape of the wires in the display areas DS can be optimized to withstand the compressive and/or tensile stresses generated from folding. Accordingly, the shape of the wires in the display areas DS formed at the folding sections 110 and 120 may be different from the shape of the wires in the display areas DS formed at the flat sections 210, 220, and 230.

Figure 4:
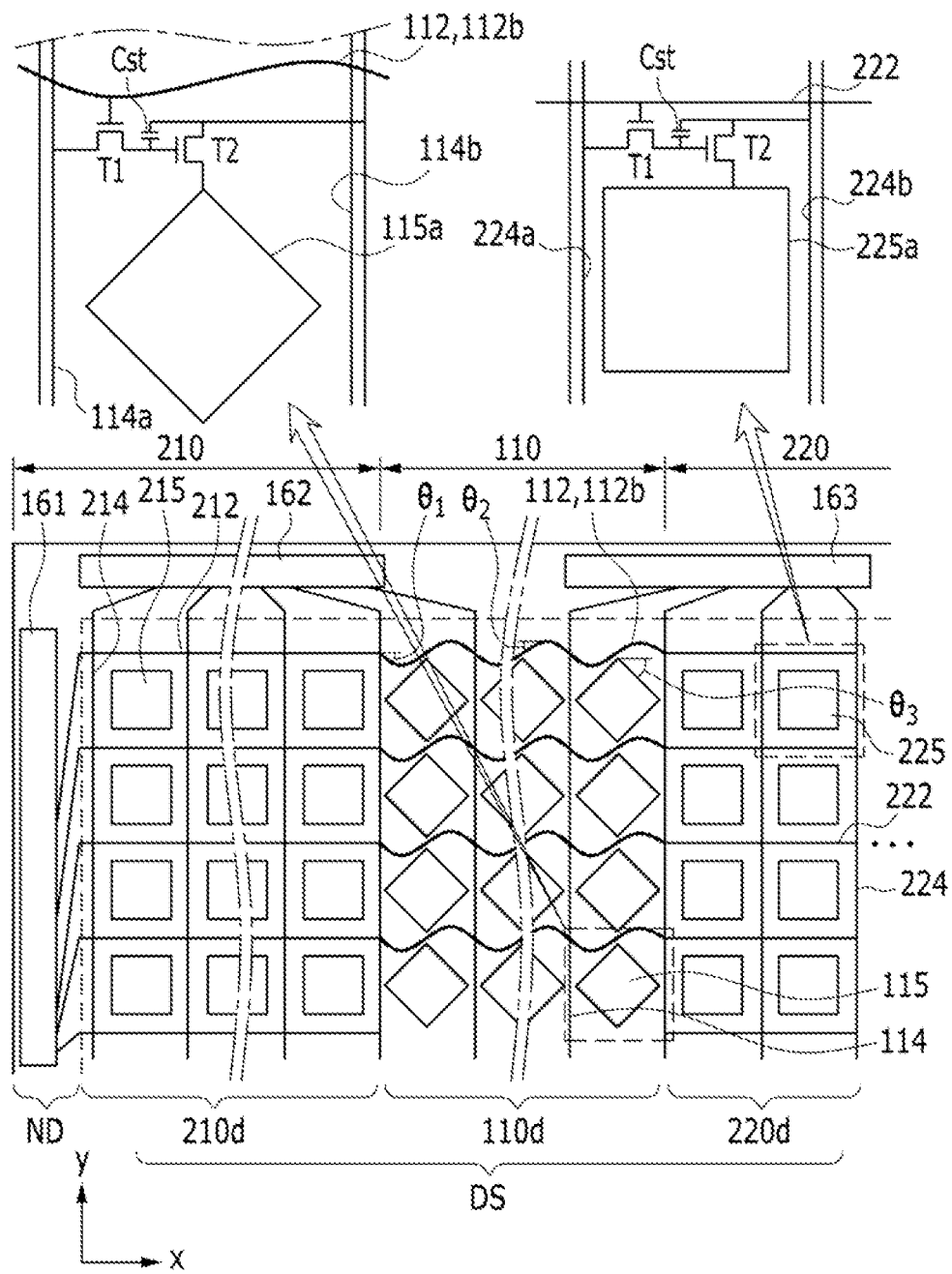
FIG. 4 shows a top plan view illustrating a flat section and a folding section of a flexible display device according to an exemplary embodiment.

FIG. 4 shows a top plan view illustrating a flat section and a folding section of a flexible display device according to an exemplary embodiment. FIG. 4 also illustrates magnified views of the respective pixel units in the flat section and the folding section.

Referring to FIG. 4, the flexible display device 10 includes the folding section 110 and the flat sections 210 and 220. The flat sections 210 and 220 are connected to each other by the folding section 110. The display areas DS for displaying images are formed on the folding section 110 and the flat sections 210 and 220. In some embodiments, the display area DS extends continuously across one or more folding sections 110 and flat sections 210, 220. The non-display area ND is formed along the edges of the display areas of the display area DS so as to surround the display areas DS in a planar manner. Pad electrodes 161, 162, and 163 may be formed in the non-display area ND, and can transmit electrical signals received from an external driver (e.g., a scan driver or a data driver). In FIG. 4, the two flat sections 210 and 220 are disposed on opposite sides of the folding section 110 and are connected to each other.

Referring to FIG. 4, the display areas 110d, 210d, and 220d on the folding section 110 and the flat sections 210 and 220 include a plurality of pixels 115, 215, and 225, and wires for supplying electrical signals to the pixels 115, 215, and 225. The wires include transverse wires 112, 212, and 222 extending transversely in a first direction (direction of the x-axis) in which the folding section 110 is folded, and longitudinal wires 114, 214, and 224 extending longitudinally in a second direction (direction of the y-axis) crossing the first direction. For example, the transverse wires 112, 212, and 222 may include gate wires that are connected to a scan driver to receive gate signals (scan signals), and the longitudinal wires 114, 214, and 224 may include data wires that are connected to a data driver to receive data signals. The longitudinal wires 114, 214, and 224 may further include driving voltage lines that are used for receiving driving voltages.

The folding section 110 may be formed on a flexible substrate. The transverse wire 112 in the display area 110d of the folding section 110 may extend in a winding configuration, and may be formed of a winding wire 112b. For example, the winding wire 112b may be formed having a wave-line shape. The transverse wires 212 and 222 in the display areas 210d and 220d of the flat sections 210 and 220 may extend linearly, similar to the wires formed in a conventional flat panel display.

The winding wire 112b formed in the folding section 110 extends in the first direction and is connected to the transverse wires 212 and 222 formed in the flat sections 210 and 220.

In the embodiment of FIG. 4, a portion of the winding wire 112b in the display area 110d of the folding section 110 is inclined at an angle $\theta_1$ with respect to the transverse wires 212 and 222 in the display area 210d and 220d of the flat sections 210 and 220. Specifically, the angle $\theta_1$ is measured at points at which the winding wire 112b in the display area 110d of the folding section 110 is connected to the transverse wires 212 and 222 in the display areas 210d and 220d of the flat sections 210 and 220. The angle $\theta_1$ may range between 0° and about 45°. Another portion of the winding wire 112b in the display area 110d of the folding section 110 is inclined at an angle $\theta_2$ with respect to an imaginary line parallel to the first wires 212 and 222 in the display areas 210d and 220d of the flat sections 210 and 220. The angle $\theta_2$ may range between 0° and about 45°. When the angles $\theta_1$ or $\theta_2$ is 0°, the wires are not bent. However, when the angles $\theta_1$ and/or $\theta_2$ exceed 45°, the wires may overlap a boundary of the pixels.

The flexible display device 10 may be formed of an organic light emitting diode display including a plurality of pixels. Each pixel includes an organic emission layer. The pixels may be connected to a plurality of signal wires and may be arranged in a matrix.

The signal wires include a plurality of gate wires that are used for transmitting gate signals (or scan signals), a plurality of data wires that are used for transmitting data signals, and a plurality of driving voltage lines that are used for transmitting driving signals. The gate wires may include the transverse wires 112, 212, and 222, and the data wires and the driving voltage lines may include the longitudinal wires 114, 214, and 224. Referring to FIG. 4, each pixel includes a switching thin film transistor T1, a driving thin film transistor T2, a storage capacitor Cst, and organic light emitting diodes (OLEDs) 115a and 225a.

Referring to FIG. 4, the switching thin film transistor T1 includes a control terminal, an input terminal, and an output terminal. The control terminal of the switching thin film transistor T1 is connected to the transverse wire 112 or 222 (i.e., the gate wire), the input terminal of the switching thin film transistor T1 is connected to the longitudinal wire 114a or 224a (i.e., the data wire), and the output terminal of the switching thin film transistor T1 is connected to the driving thin film transistor T2. The switching thin film transistor T1 is configured to transmit a data signal that is applied to the longitudinal wire 114a or 224a and to the driving thin film transistor T2, in response to a gate signal that is applied to the transverse wire 112 or 222.

Similarly, the driving thin film transistor T2 includes a control terminal, an input terminal, and an output terminal. The control terminal of the switching thin film transistor T2 is connected to the switching thin film transistor T1, the input terminal of the switching thin film transistor T2 is connected to the longitudinal wire 114b or 224b (i.e., the driving voltage line), and the output terminal of the switching thin film transistor T2 is connected to the organic light emitting diode. The driving thin film transistor T2 is configured to output an output current. The magnitude of the output current can be varied according to a voltage between the control terminal and the output terminal.

The storage capacitor Cst is connected between the input terminal and the control terminal of the driving thin film transistor T2. The storage capacitor Cst is configured to charge the data signal that is applied to the control terminal of the driving thin film transistor T2, and to maintain the data signal even after the switching thin film transistor T1 is turned off.

The organic light emitting diode includes an anode that is connected to the output terminal of the driving thin film transistor T2, and a cathode that is connected to the common voltage line. The organic light emitting diode displays an image by emitting light, and the magnitude of the emitted light can be varied according to the output current of the driving thin film transistor T2. In the magnified views of FIG. 4, the organic light emitting diodes 115a and 225a are shown having a shape similar to that of the pixels 115 and 225. The shape of the pixels 115 and 225 is defined by a pixel defining layer, and an organic emission layer is formed therein. The shape of the pixels may be, for example, rectangular or square.

The switching and driving thin film transistors T1 and T2 may be n-channel field effect transistors or p-channel field effect transistors. Those skilled in the art would recognize that the switching and driving thin film transistors T1 and T2, the storage capacitor Cst, and the organic light emitting diode may be interconnected in different configurations.

In the embodiment of FIG. 4, the pixels 115 in the display area 110d of the folding section 110 are formed having boundaries that are inclined with respect to the boundaries of the pixels 215 and 225 in the display areas 210d and 220d of the flat sections 210 and 220. Specifically, the boundaries of the pixels 115 in the display areas 110d of the folding section 110 are inclined at an angle $\theta_3$ with respect to the boundaries of the pixels 215 and 225 in the display areas 210d and 220d of the flat sections 210 and 220. The angle $\theta_3$ may range between 0° and about 45°.

Furthermore, the pixels 115 in the display area 110d of the folding section 110 may be formed having substantially the same cross-section as the pixels 215 and 225 in the display areas 210d and 220d of the flat sections 210 and 220.

As such, the winding wire 112b may have a portion extending parallel to the inclined boundaries of the pixels 115 when the winding wire 112b is formed in the display area 110d of the folding section 110.

Figure 5:
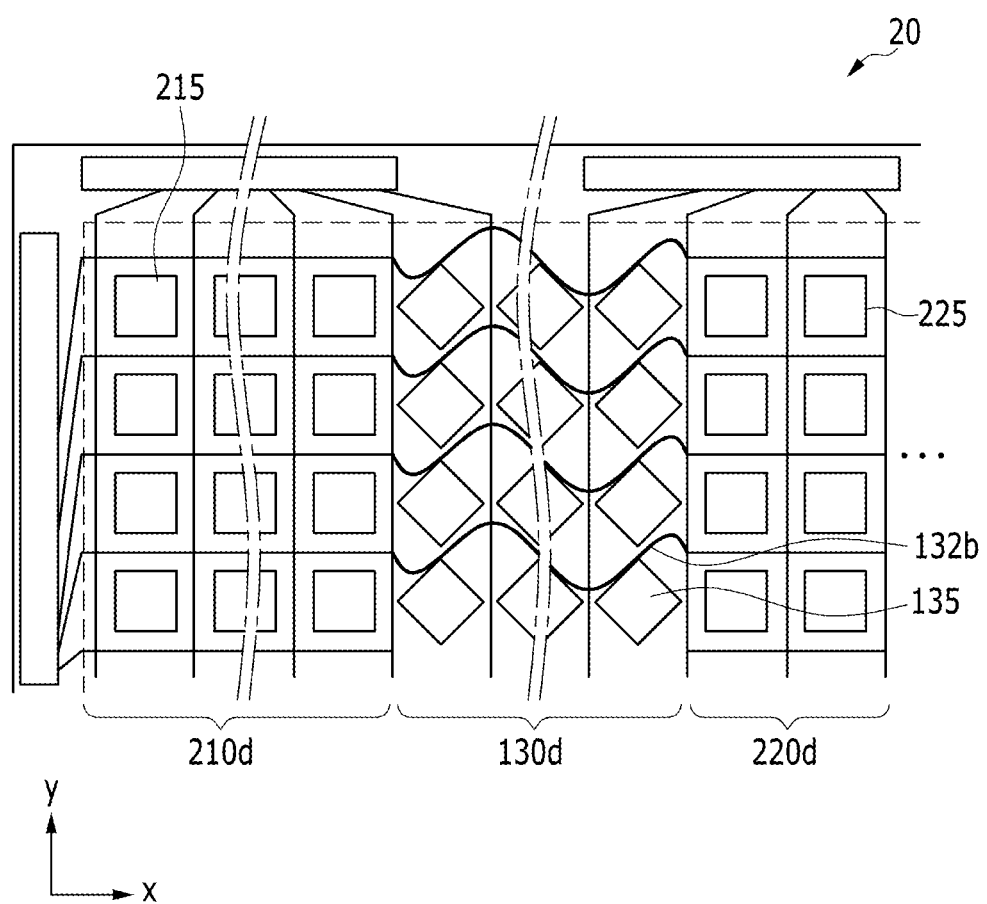
FIG. 5 is a top plan view illustrating a flat section and a folding section of a flexible display device according to another exemplary embodiment.

FIG. 5 is a top plan view illustrating a flat section and a folding section of a flexible display device according to another exemplary embodiment.

Referring to FIG. 5, a flexible display device 20 includes a winding wire 132b formed in a display area 130d of the folding section 110. The flexible display device 20 of FIG. 5 is similar to the flexible display device 10 of FIG. 4 except for the curvature radius of the bent portion of the winding wire. Specifically, the curvature radius of the bent portion of the winding wire 132b in FIG. 5 is greater than the curvature radius of the bent portion of the winding wire 112b in FIG. 4. The curvature radius of the bent portion of the winding wire may be varied depending on the size and shape of the pixels.

In the embodiment of FIG. 5, pixels 135 in the display area 130d of the folding section 110 are formed having boundaries that are inclined with respect to the boundaries of the pixels 215 and 225 in the display areas 210d and 220d of the flat sections 210 and 220. Furthermore, the pixels 135 in the display area 130d of the folding section 110 may be formed having substantially the same area as the pixels 215 and 225 in the display areas 210d and 220d of the flat sections 210 and 220.

As such, the winding wire 132b may have a portion extending parallel to the inclined boundaries of the pixels 135 when the winding wire 132b is formed in the display area 130d of the folding section 110.

Figure 6:
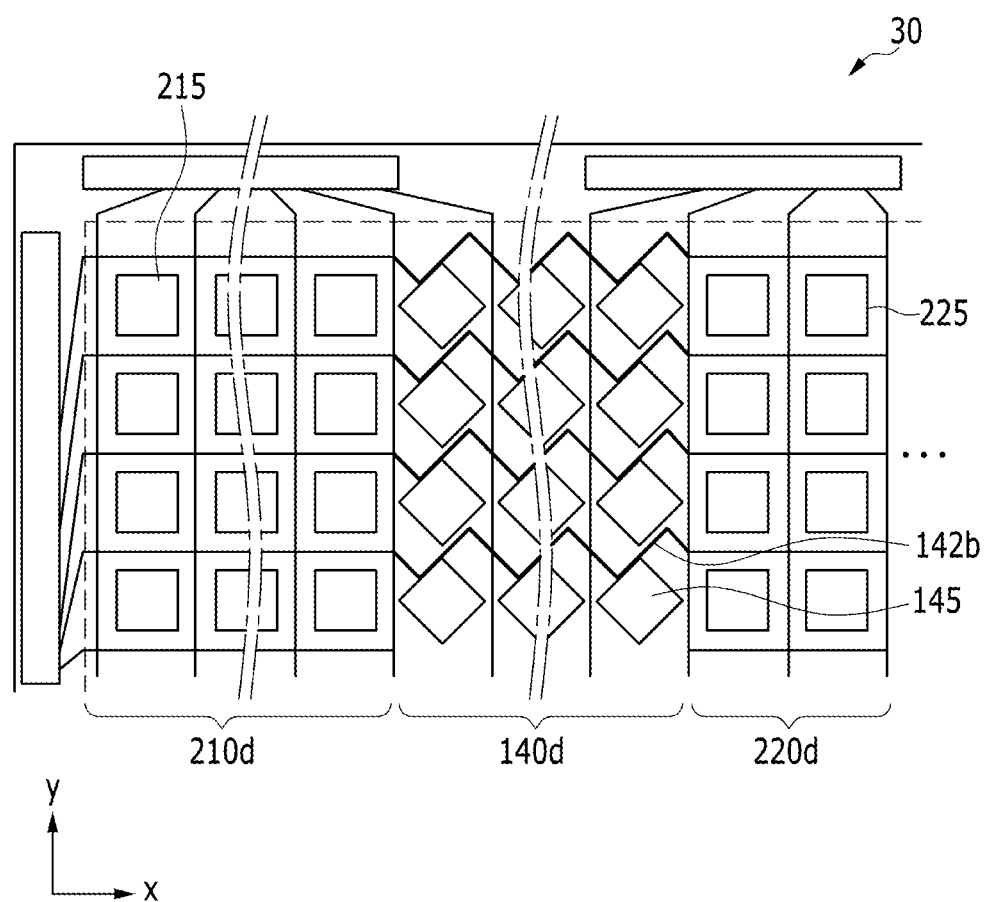
FIG. 6 is a top plan view illustrating a flat section and a folding section of a flexible display device according to another exemplary embodiment.

FIG. 6 is a top plan view illustrating a flat section and a folding section of a flexible display device according to another exemplary embodiment.

Referring to FIG. 6, a flexible display device 30 includes a winding wire 142b formed in a display area 140d of the folding section 110. The flexible display device 30 of FIG. 6 is similar to the flexible display device 10 of FIG. 4 except for the shape of the winding wire. In the embodiment of FIG. 4, the winding wire 142b is formed having a zigzag shape that is repeatedly bent from the bent portion at a predetermined angle as the winding wire 142b extends.

In the embodiment of FIG. 6, pixels 145 in the display area 140d of the folding section 110 are formed having boundaries that are inclined with respect to the boundaries of the pixels 215 and 225 in the display areas 210d and 220d of the flat sections 210 and 220. Furthermore, the pixels 145 in the display area 140d of the folding section 110 may be formed having substantially the same area as the pixels 215 and 225 in the display areas 210d and 220d of the flat sections 210 and 220.

As such, the winding wire 142b may have a portion extending parallel to the inclined boundaries of the pixels 145 when the winding wire 142b is formed in the display area 140d of the folding section 110.

Figure 7:
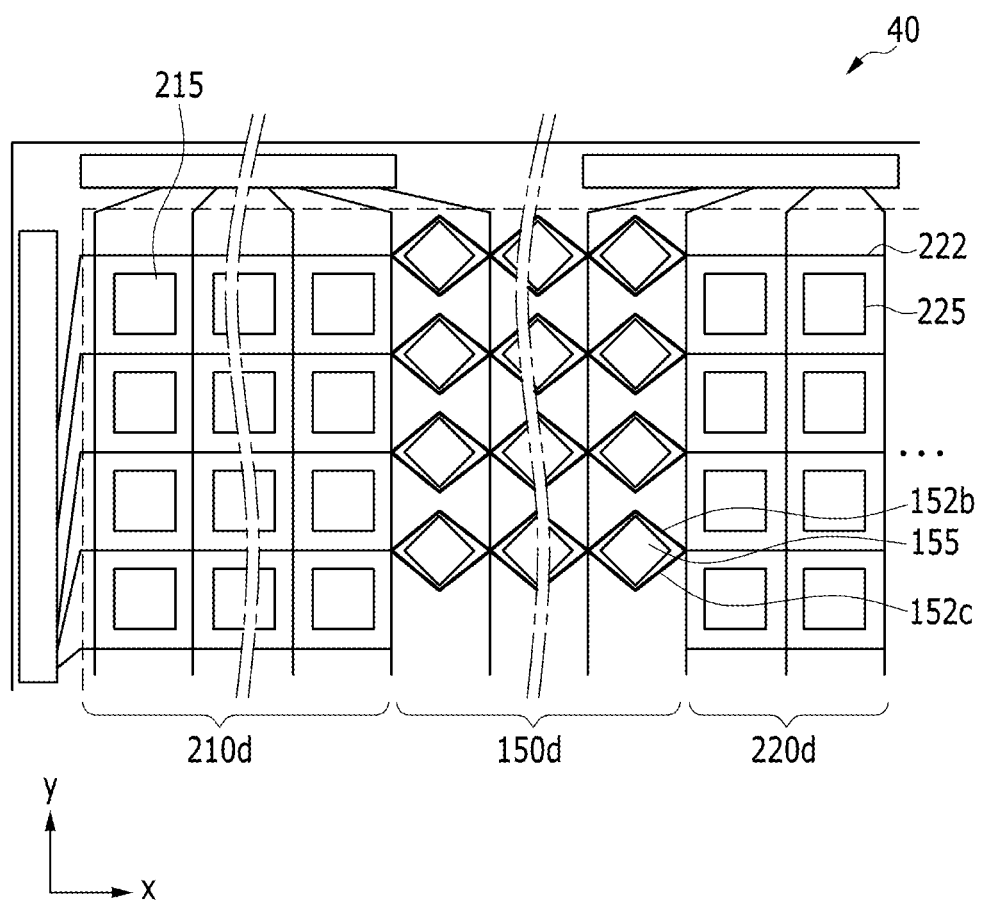
FIG. 7 is a top plan view illustrating a flat section and a folding section of a flexible display device according to another exemplary embodiment.

FIG. 7 is a top plan view illustrating a flat section and a folding section of a flexible display device according to another exemplary embodiment.

Referring to FIG. 7, a flexible display device 40 includes winding wires 152b and 152c formed in a display area 150d of the folding section 110. The flexible display device 40 of FIG. 7 is similar to the flexible display device 10 of FIG. 4 except for the shape and the number of winding wires. In the embodiment of FIG. 7, the winding wires 152b and 152c may branch out and extend from the respective transverse wires 212 and 222 in the display areas 210d and 220d of the flat sections 210 and 220. Also, the winding wire 152b may have a shape that is repeatedly bent from the bent portion at a predetermined angle as the winding wire 152b extends.

In the embodiment of FIG. 7, pixels 155 in the display area 150d of the folding section 110 are formed having boundaries that are inclined with respect to the boundaries of the pixels 215 and 225 in the display areas 210d and 220d of the flat sections 210 and 220. The winding wires 152b and 152c extend along and surround the pixels 155 in the display area 150d of the folding section 110, and re-connect/combine with the transverse wires 212 and 222 in the display area 210d and 220d of the flat sections 210 and 220 at an end of the display area 150d of the folding section 110. As a result, the winding wires 152b and 152c in the display area 150d of the folding section 110 may be formed in the above configuration so as to surround the pixels 155.

Figure 8:
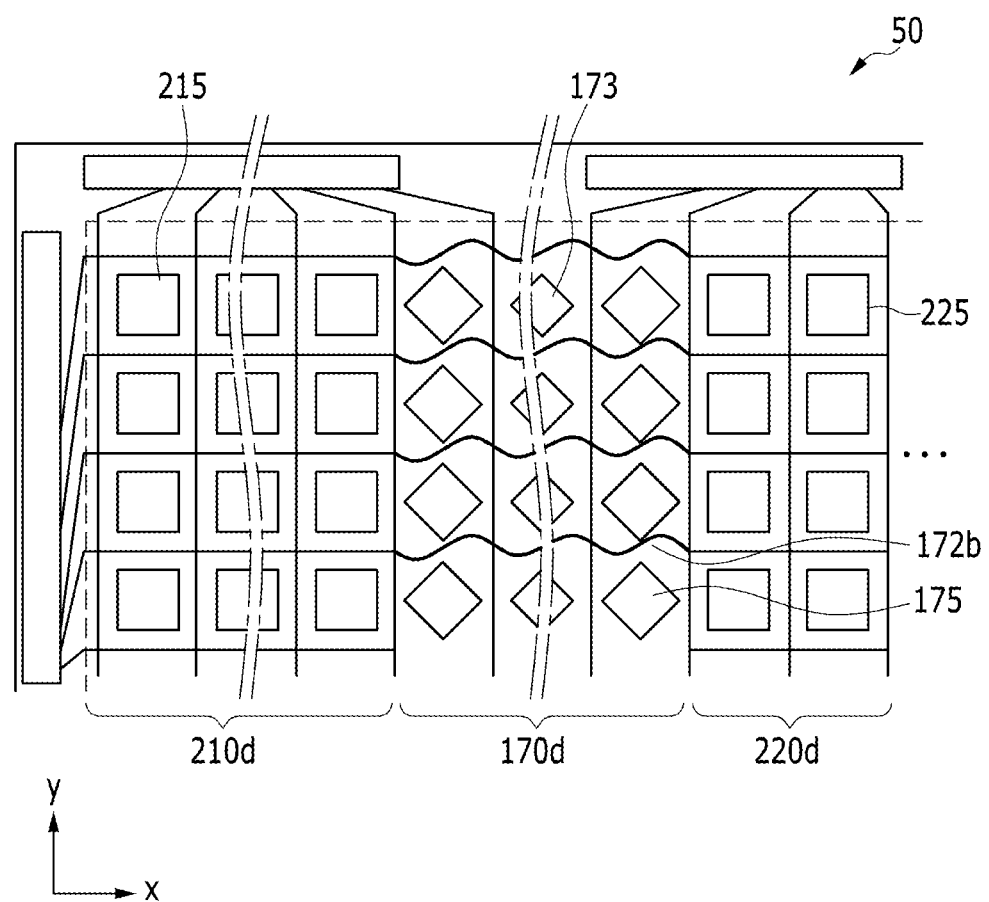
FIG. 8 is a top plan view illustrating a flat section and a folding section of a flexible display device according to another exemplary embodiment.

FIG. 8 is a top plan view illustrating a flat section and a folding section of a flexible display device according to another exemplary embodiment.

Referring to FIG. 8, a flexible display device 50 includes a winding wire 172b formed in a display area 170d of the folding section 110. The flexible display device 50 of FIG. 8 is similar to the flexible display device 10 of FIG. 4 except for the size of some of the pixels. The winding wire 172b is formed having the same shape as the winding wire 112b shown in FIG. 4.

In the embodiment of FIG. 8, pixels 173 and 175 in the display area 170d of the folding section 110 are formed having boundaries that are inclined with respect to the boundaries of the respective pixels 215 and 225 in the display areas 210d and 220d of the flat sections 210 and 220. The pixels 173 are formed having a smaller area than the pixels 215 and 225 in the display areas 210d and 220d of the flat sections 210 and 220. As such, the display area 170d of the folding section 110 may include a plurality of pixel arrays, and the pixel array that is disposed at the center of the display area 170d includes the pixels 173. In particular, the pixels 173 in the pixel array that is disposed at the center of the display area 170d may be formed having a smaller area than the pixels 175 in the pixel arrays that are disposed at the edges of the display area 170d.

Figure 9:
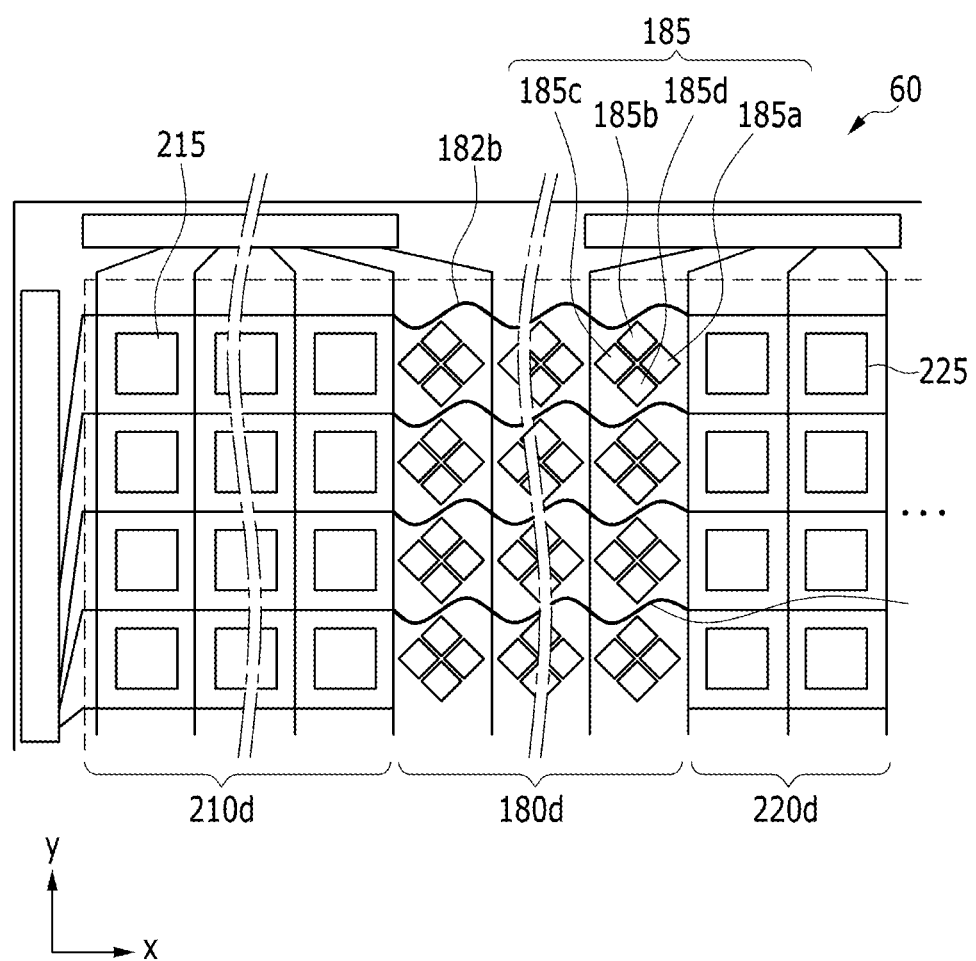
FIG. 9 is a top plan view illustrating a flat section and a folding section of a flexible display device according to another exemplary embodiment.

FIG. 9 is a top plan view illustrating a flat section and a folding section of a flexible display device according to another exemplary embodiment.

Referring to FIG. 9, a flexible display device 60 includes a winding wire 182b formed in a display area 180d of the folding section 110. The flexible display device 60 of FIG. 9 is similar to the flexible display device 10 of FIG. 4, except some of the pixels in FIG. 9 are further divided into subpixels. The winding wire 182b is formed having the same shape as the winding wire 112b shown in FIG. 4.

In the embodiment of FIG. 9, pixels 185 in the display area 180d of the folding section 110 may be formed having boundaries that are inclined with respect to the boundaries of the pixels 215 and 225 in the display areas 210d and 220d of the flat sections 210 and 220. Each of the pixels 185 in the display area 180d of the folding section 110 may be formed having a rhombic shape by equally dividing each pixel into four subpixels 185a, 185b, 185c, and 185d. In the above embodiment, the subpixels 185a, 185b, 185c, and 185d may be formed having a rhombic shape.

In contrast to the pixels 215 and 225 in the display areas 210d and 220d of the flat sections 210 and 220, the pixels 185 in the display area 180d of the folding section 110 can withstand more compressive and/or tensile stresses due to the shape in which the pixels 185 are formed.

FIG. 10A to FIG. 10I are top plan views illustrating the various shapes and configurations of a subpixel that can be applied to a pixel in the display area of the folding section of the flexible display device shown in FIG. 9.

Figure 10A:
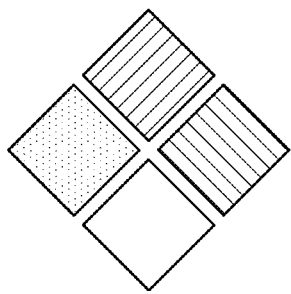
FIG. 10A to FIG. 10I are top plan views illustrating the various shapes and configurations of a subpixel that can be applied to a pixel in the display area of the folding section of the flexible display device shown in FIG. 9.
Figure 10B:
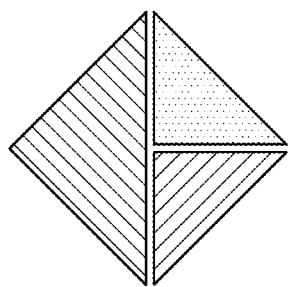
Figure 10C:
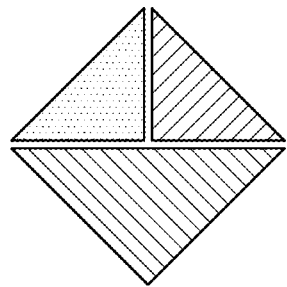
Figure 10D:
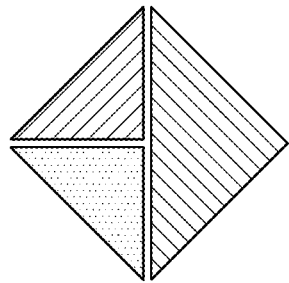
Figure 10E:
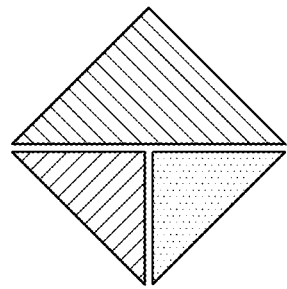
Figure 10F:
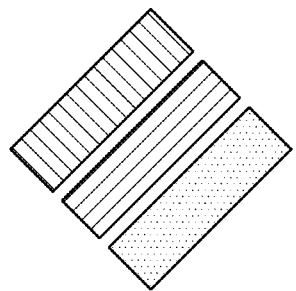
Figure 10G:
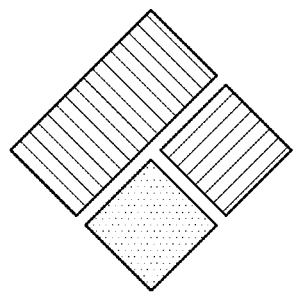
Figure 10H:
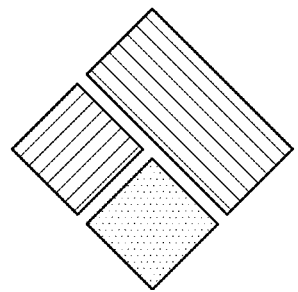
Figure 10I:
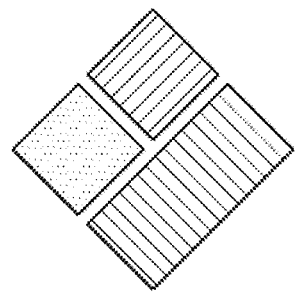

FIG. 10A illustrates the shape of the pixel 185 in the display area 180d of the folding section 110 shown in FIG. 9. As previously described, the pixel 185 is equally divided into four subpixels having the rhombic shape. FIG. 10B to FIG. 10E illustrate further examples of the shape of a pixel that is divided into three triangular subpixels. In the embodiments of FIG. 10B to FIG. 10E, two of the subpixels have the same area, and the third subpixel has a larger area. FIG. 10F illustrates the shape of a pixel that is divided into three rectangular subpixels. FIG. 10G to FIG. 10I illustrate further examples of the shape of a pixel that is divided into three subpixels consisting of two square subpixels and one rectangular subpixel.

In the embodiments of FIG. 10B to FIG. 10I, when the pixel 185 is divided into three subpixels, the subpixels may emit red light, green light, and blue light, respectively. In the embodiment of FIG. 10A, when the pixel 185 is divided into four subpixels, the subpixels may emit red light, green light, blue light, and white light, respectively.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A flexible display device comprising:
a folding section formed on a flexible substrate;
a flat section connected to the folding section; and
a display area for displaying an image, wherein the display area is formed on the folding section and the flat section,
wherein each of the display areas of the folding section and the flat section includes a plurality of pixels and a plurality of wires for supplying electrical signals to the pixels, and
wherein the wires in the display area of the folding section include a winding wire extending in a winding configuration on the flexible substrate.

2. The flexible display device of claim 1, wherein the winding wire in the display area of the folding section is formed having a wave-line shape.

3. The flexible display device of claim 1, wherein the winding wire in the display area of the folding section includes a bent portion that extends and bends at a pre-determined angle.

4. The flexible display device of claim 1, wherein the winding wire in the display area of the folding section branches out and extends from the wires in the display area of the flat section, and
a vertical width of the winding wire repeatedly increases and decreases along a direction in which the winding wire extends.

5. The flexible display device of claim 1, wherein the wires in the display area of the folding section have a longer length per unit area than the wires in the display area of the flat section.

6. The flexible display device of claim 1, wherein the winding wire in the display area of the folding section extends in a direction in which the folding section is folded.

7. The flexible display device of claim 1, wherein the winding wire in the display area of the folding section includes a gate wire.

8. A flexible display device comprising:
a folding section;
a flat section connected to the folding section; and
a display area for displaying an image, wherein the display area is formed on the folding section and the flat section,
wherein each of the display areas of the folding section and the flat section includes a plurality of pixels, and
wherein the pixels in the display area of the folding section have boundaries that are inclined with respect to the boundaries of the pixels in the display area of the flat section.

9. The flexible display device of claim 8, wherein the pixels in the display area of the folding section have a rhombic shape.

10. The flexible display device of claim 8, wherein each pixel in the display area of the folding section is divided into at least three subpixels.

11. The flexible display device of claim 8, wherein each pixel in the display area of the folding section is equally divided into four subpixels, and
the four subpixels respectively emit red light, green light, blue light, and white light.

12. The flexible display device of claim 8, wherein the display area in the folding section includes pixels that are smaller than the pixels in the display area of the flat section.

13. A flexible display device comprising:
a folding section formed on a flexible substrate;
a flat section connected to the folding section; and
a display area for displaying an image, wherein the display area is formed on the folding section and the flat section,
wherein each of the display areas of the folding section and the flat section includes a plurality of pixels and a plurality of wires for supplying electrical signals to the pixels,
wherein the wires in the display area of the folding section include a winding wire extending in a winding configuration on the flexible substrate, and
wherein the pixels in the display area of the folding section have boundaries that are inclined with respect to the boundaries of the pixels in the display area of the flat section.

14. The flexible display device of claim 13, wherein the winding wire includes a portion extending parallel to the boundaries of the pixels in the display area of the folding section.

15. The flexible display device of claim 13, wherein the winding wire branches out and extends from the wires in the display area of the flat section, and surrounds the pixels in the display area of the folding section.

16. The flexible display device of claim 13, wherein the flat section includes at least two flat sections, and
the folding section is disposed between adjacent flat sections.

17. The flexible display device of claim 13, wherein the display area is an organic light emitting diode display panel.

* * * * *